United States Patent [19]

Peeters

[11] 4,179,655

[45] Dec. 18, 1979

[54] MOVING COIL INSTRUMENT WITH LINEAR CHARACTERISTIC

[75] Inventor: Peter M. J. Peeters, Herts, England

[73] Assignee: U.S. Philips Corporation, New York, N.Y.

[21] Appl. No.: 816,000

[22] Filed: Jul. 15, 1977

[30] Foreign Application Priority Data

Aug. 2, 1976 [NL] Netherlands .......................... 7608559

[51] Int. Cl.$^2$ ...................... G01R 15/10; G01R 19/22
[52] U.S. Cl. ..................................... 324/132; 324/119
[58] Field of Search ................ 324/132, 119; 328/143; 364/573; 307/229

[56] References Cited

U.S. PATENT DOCUMENTS 3,315,162  4/1967  Liddle .................................. 324/132

FOREIGN PATENT DOCUMENTS 697058  10/1940  Fed. Rep. of Germany ........... 324/132
1221356  7/1966  Fed. Rep. of Germany ........... 324/132
1466677  1/1969  Fed. Rep. of Germany ........... 324/132

Primary Examiner—Rudolph V. Rolinec
Assistant Examiner—Ernest F. Karlsen
Attorney, Agent, or Firm—Thomas A. Briody; William J. Streeter; Bernard Franzblau

[57] ABSTRACT

The accuracy and linearity of a moving-coil instrument is determined by the choice of materials, the design and the production tolerances.

The invention proposes to make an inaccurate moving-coil meter with a non-linear relationship between meter current and meter deflection accurate and to provide it with a linear scale by adding a diode-resistor network and adjusting said network so that said accurate linear scale is obtained. Direct current or direct voltage inputs are then possible. An inexpensive accurate, analog indicating instrument is then obtained which may be used in a variety of measuring systems.

12 Claims, 14 Drawing Figures

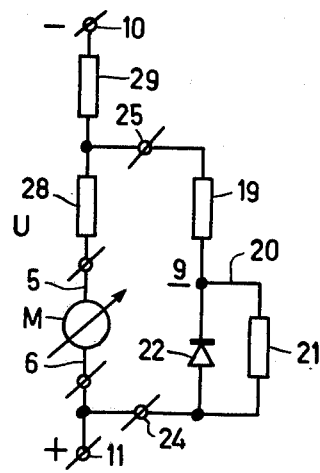
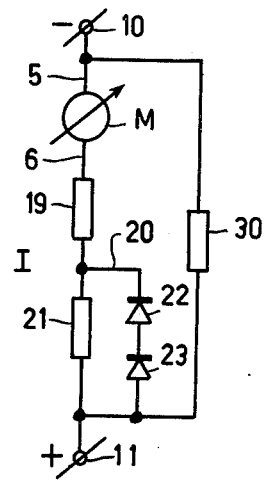
Fig. 10 Fig. 11
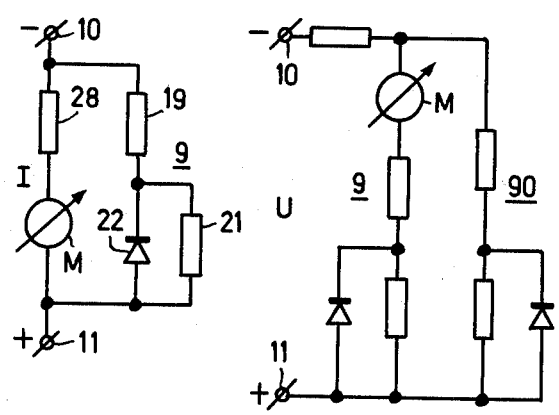
Fig. 12  Fig. 13  Fig. 14

MOVING COIL INSTRUMENT WITH LINEAR CHARACTERISTIC

The invention relates to a moving-coil instrument with a linear characteristic, comprising a magnet core with a yoke, a coil which is rotatable about an axis in the air gap of the yoke, and means for correcting the non-linear relationship between the angular rotation of the coil produced by a direct current which flows through the coil and a d.c. quantity applied to the instrument.

In such moving-coil instruments a permanent-magnetic field exists in an air gap in which a coil is movable. A pointer is secured to the coil and thereby provides an indication on a scale. When a current flows through the coil the coil is subject to a force which is proportional to the current and proportional to the strength of the locally existing magnetic field. A spring counteracts the movement of the coil produced by the force so that a certain angular rotation of the coil is obtained which is, inter alia, determined by the spring properties, current, magnetic field and the total length of the coil wires which are disposed in the magnetic field. It is evident that the indicating accuracy of such an instrument is dependent on mechanical tolerances.

During the design and during the manufacture these tolerances can be minimized so that accurate and reproducible pointer deflections as a function of the current through the meter coil can be obtained. In such cases it is also possible to make a scale which, once it has been calibrated for the desired quantity to be indicated, can be mass-manufactured. Generally it is then found that the scale graduation which is obtained after calibration has a non-linear character. One of the causes to which this may be attributed is an inhomogeneous magnetic field in the air gap.

A drawback of the non-linear scale is that it does not promote a convenient layout and readability. Moreover, the manufacture of such moving-coil meters is complicated and expensive. However, if a linear standard scale could be used, these disadvantages would be largely eliminated.

It is known from German Patent specification No. 2,056,323, which has been laid open for public inspection on June 3, 1971, to provide a solution for the said problem which is based on making the magnetic field strength in the air gap vary in accordance with a certain formula. For this purpose the shape of the yoke and of the magnet, which is arranged inside the coil, should meet specific requirements.

This Patent specification also states that it is possible to mount correction elements on the yoke or magnet in order to obtain a constant magnetic field over the total angle of rotation. However, said elements must be fitted during the production process and this is found to be not entirely satisfactory.

Both known solutions are not suitable for the manufacture of accurate moving-coil meters. The mechanical tolerances remain so that the meters have only a low accuracy.

It is an object of the invention to provide a very accurate moving-coil instrument with a linear scale.

For this purpose it was appreciated that mechanical tolerances during manufacture are inevitable, that therefore these tolerances have to be accepted to a certain degree, that these tolerances are unknown but can be made constant by the choice of materials per instrument, i.e. that they do not drift by aging, and furthermore that their influence on the indication can be eliminated with the aid of electrical circuits. These electrical circuits are accurate and reliable and can be adjusted simply for each individual instrument during manufacture.

A moving-coil instrument of the type mentioned in the preamble is therefore characterized in that the coil is included in a diode-resistor network having two input terminals to which the d.c. quantity is applied. The direct current distribution among the diodes, resistors and coil are such that the angular rotation is a substantially linear function of the d.c. quantity.

The advantage of a moving-coil instrument in accordance with the invention is that a very accurate meter is obtained with a linear scale, which can be manufactured cheaply, and on the basis of an inaccurate meter to which an electrical network is added. In this respect it is to be noted that such networks are known per se.

It is also known to manufacture measuring instruments with a moving-coil meter in which diode-resistor networks are included. These networks always have linearizing and correcting functions which are necessary for measuring a.c. quantities with a d.c. meter by means of rectifier diodes. For this it is always assumed that the moving coil meter is a circuit component which provides a correct indication. Examples of this are found in German Patent specification No. 697058 and in the German Patent specification No. 1,466,677, which has been laid open for public inspection on Jan. 16, 1969. In contradistinction to this, the invention relates to the moving-coil instrument itself, to which a direct voltage is applied or through which a direct current is passed.

In a simple embodiment a moving-coil instrument in accordance with the invention comprises at least one branch consisting of a series connection of a first resistor with a first parallel connection, which comprises a second resistor in parallel with at least one first diode which is connected in the forward direction. By including the coil in series an accurate voltmeter is obtained. By connecting a resistor in parallel with this, an accurate ammeter is obtained.

In other embodiments said branch is connected in parallel with the coil in series with a resistor. An accurate ammeter is then obtained; whereas a voltmeter is obtained when a further resistor is connected in series therewith.

Combinations of several branches in series or parallel enable more complicated corrections to be performed.

It is also found that said branches enable the accurate linearization of moving-coil meters with a centre-zero scale. In embodiments of the invention an anti-parallel branch of diodes is for this purpose added to the said diode or series-connected diodes, as the case may be, with a resistor in series to correct for asymmetrical deviations to the left and right of the zero point. In this case it is possible to connect a plurality of branches in series or parallel.

In practice it was found that these simple and cheap components in the said branches suffice to obtain class 1.5 instruments (1.5% accuracy) with a linear scale having an accuracy of better than a half percent.

For more intricate and local corrections it is evident that further combinations of resistors and diodes can be found.

Some embodiments of a moving-coil instrument in accordance with the invention will be described with reference to the drawing, in which FIG. 1 schematically shows a moving-coil instrument with additional network, FIG. 2, FIG. 3, FIG. 4 and FIG. 5 show some characteristics to be corrected, FIG. 6 shows a simple diode-resistor network, FIG. 7 shows the network of FIG. 6 for centre-zero meters, FIG. 8 shows the network of FIG. 7 for asymmetrical characteristics, FIG. 9 shows a voltmeter corrected for the characteristic of FIG. 2, FIG. 10 shows a voltmeter for the characteristic of FIG. 3, FIG. 11 shows an ammeter in accordance with FIG. 2., FIG. 12 shows an ammeter in accordance with FIG. 3, FIG. 13 shows a voltmeter in accordance with FIG. 4, and FIG. 14 shows an ammeter in accordance with FIG. 4.

In FIG. 1 the schematically shown housing of a moving-coil instrument bears the reference numeral 1. This instrument comprises a magnet system with a yoke and an air gap 3 in which a coil 4 is movable as a result of a direct current which is applied thereto via supply leads 5 and 6. To the coil system a pointer 7 is secured which, as a result of the angular rotation of the coil 4, provides an indication on a linear scale 8. In accordance with the invention a diode-resistor network 9 has been added which has connection terminals 10 and 11 for applying the d.c. electric quantity to be measured to the instrument, for example a direct voltage or a direct current. The supply leads 5 and 6 are connected to this network.

Figure 1:
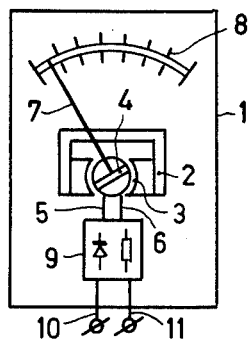

A resistor 19 is included in series with a parallel connection 20 consisting of a resistor 21 and a diode 22. As the case may be, diode 22 may be connected in series with one or more diodes 23. To the terminal 24 a current is applied which is returned via terminal 25. For small currents or voltages at the terminals the diodes 22, 23 as yet will have no effect. At increasing current or voltage the diodes become more conductive and their d.c. resistance decreases so that the impedance of the parallel connection 20 decreases accordingly.

Figure 5:
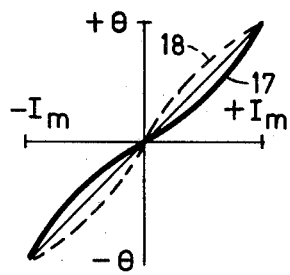
FIG. 5 shows a characteristic as may occur with meters having a centre-scale zero point.
Figure 6:
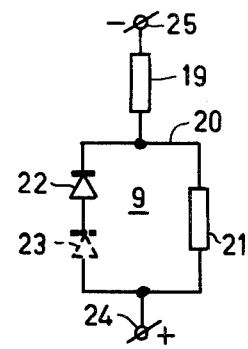
FIG. 6 shows a diode-resistor network which will suffice for most moving-coil instruments.
Figure 7:
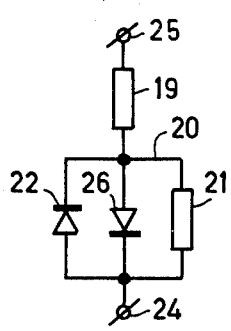
Figure 8:
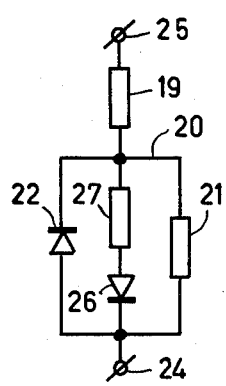

FIG. 7 shows the network of FIG. 6 to which a diode 26 connected in anti-parallel has been added. This network is suitable for linearizing the curves 17 and 18 of FIG. 5 when these curves are symmetrical about the zero point. In the event of asymmetry in these curves, a resistor 27 may be included in series with the diode 26, as is shown in FIG. 8.

Figure 9:
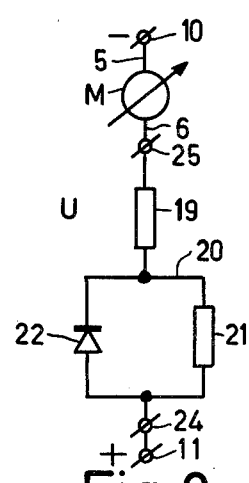

FIG. 9 schematically shows a moving-coil instrument in accordance with FIG. 1 in which the moving coil section is designated M. A curve in accordance with FIG. 2 has been corrected with the diode-resistor network 9 in accordance with FIG. 6. The meter M with a coil 4 is included in series with the network 9.

Figure 3:
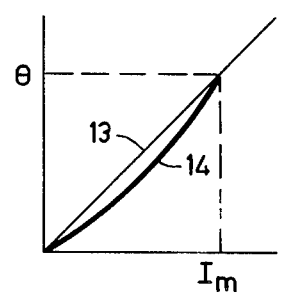
FIG. 3 shows a curve 14 which exhibits a deviation from the line 13 which is opposed to that in accordance with FIG. 2.

FIG. 10 shows a moving-coil instrument which measures voltage and which is corrected for a meter curve 14 as shown in FIG. 3 and with a network 9 in accordance with FIG. 6.

The coil of the meter M with its supply leads 5 and 6 is included in series with a resistor 28. Across this resistor a network 9 in accordance with FIG. 6 is connected in parallel. This parallel connection, in series with a resistor 29, is included between the terminals 10 and 11. By the potentiometer action of the resistor 29 with the other part of the circuit, the voltage across this part increases owing to an increasing input voltage at the terminals 10 and 11.

However, owing to the action of the diode 22 the overall resistance of this potentiometer section decreases and the voltage increase then decreases relative to an input voltage increase. Moreover, more current passes through the network 9 relative to the current through the meter M.

Thus, this is in accordance with the characteristic 14 in FIG. 3, in which for an increasing current $I_m$ through the meter the angular rotation $\theta$ increases beyond linearity, or in other words for increasing angular rotation relatively, i.e. incrementally, less meter current is required.

Figure 2:
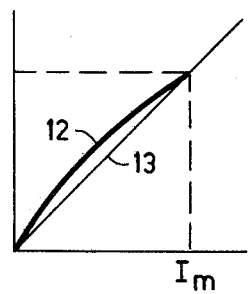
FIG. 2 shows a characteristic 12 which gives the relationship between the angular rotation $\theta$ of the coil as a function of the direct current $I_m$ through the coil. The deviation from the linear curve 13 has been slightly exaggerated for the sake of clarity.

FIG. 11 shows a current meter in accordance with the diagram of FIG. 9, but with a parallel resistor 30 included between the terminals 10 and 11. Thus, the characteristic of FIG. 2 is corrected. As the current through the instrument from terminal 11 to terminal 10 increases, the diodes 22 and 23 give rise to a current distribution which is designed so that relatively more current flows through the meter circuit at the expense of the current through the parallel resistor 30. This is in accordance with the curve 12 of FIG. 2, in which for an increasing $\theta$ the meter current $I_m$ should increase incrementally.

FIG. 12 shows a current meter in accordance with the diagram of FIG. 10, but in this case the resistor 29 may be dispensed with. The current distribution among the branch consisting of the meter M and series resistor 28 and the branch including the network 9 is again such that when the current from terminal 11 to terminal 10 increases, relatively less current flows through the meter section, as is shown by the curve 14 in FIG. 3.

FIG. 13 shows a combination of the diagrams of FIGS. 9 and 10. This combination comprises a series branch 9 in accordance with FIG. 6 and a parallel branch 90 in accordance with the network 9 of FIG. 6. These branches can be dimensioned so that in the case of smaller input voltages the network 9 has a greater influence than the network 90, which means that the initial characteristic of FIG. 2 is obtained, after which at higher input voltages the network 90 becomes predominant so that the final portion of the curve 14 of FIG. 3 is obtained.

Figure 4:
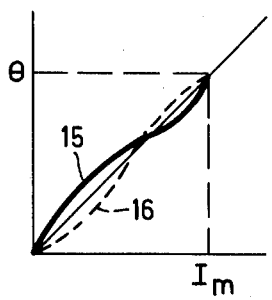
FIG. 4 shows a curve 15 and a curve 16 which exhibit a bending point. Such characteristics generally are the result of fringe effects which become particularly distinct near the zero point and at full-scale deflection.

This yields the overall curve 15 of FIG. 4. If the diode chain in network 9 is not yet active at small currents, but the corresponding diodes in the network 90 are active, this initially yields the effect of the circuit arrangement of FIG. 10 with the associated initial curve in accordance with 14 of FIG. 3, after which the circuit of FIG. 9 becomes predominant with the final curve in accordance with 12 of FIG. 2. In that case a correction is obtained as shown by the curve 16 in FIG. 4.

The curves 15 and 16 of FIG. 4 can also be corrected for use in ammeters. For this purpose the diagrams of FIG. 11 and FIG. 12 may be combined. This is shown in FIG. 14.

If the action of the circuit of FIG. 11 dominates relative to the network 90 in FIG. 14, curve 12 of FIG. 2 is initially followed for small currents, after which the network 90 becomes predominant and the final portion of the curve 14 of FIG. 3 is followed. This yields the curve 15 of FIG. 4 as the correction curve. In the case of a reverse sequence, an increasing current correction is effected in accordance with curve 16 in FIG. 4.

The moving-coil instrument in accordance with FIGS. 9 through 14 may also be equipped with one or more networks in accordance with FIG. 7 or FIG. 8 for meters with a zero point in the scale centre. For convenience this possibility is not shown in the Figures. In practice it is found that it generally suffices to use the diode-resistor networks described for the correction of the non-linearity between the meter current and pointer deflection.

The principle underlying the invention may also be applied to more intricate non-linear relationships, for example, of the type with several bending points. More and differently arranged diodes and resistors are then needed. Moreover, the adjusting procedure will be slightly more difficult.

Finally it is to be noted that the temperature sensitivity of a moving-coil instrument in accordance with the invention remains within the desired limits of accuracy over a reasonable temperature range. Obviously, it is still possible to use known compensation measures such as correction in the meter section or temperature-dependent resistors in order to obtain a higher accuracy over a wider temperature range.

What is claimed is:

1. A moving coil instrument provided with a linear deflection characteristic comprising, a magnet core and a yoke with an air gap to accommodate a rotatable coil, a coil rotatable about an axis and located within the yoke air gap, a non-linear relationship normally existing between the angular rotation of the coil and a direct current flowing in the coil in response to a DC electric quantity applied to the instrument, means for correcting said non-linear relationship comprising a diode-resistor network having two input terminals, means for applying the DC electric quantity to said two input terminals, said diode-resistor network comprising a first branch circuit including a first resistor connected in series with a first parallel circuit that includes a second resistor in parallel with at least one first diode connected in the forward direction relative to the DC electric quantity applied to said two input terminals and, in parallel with the first diode, a series connection of a third resistor and a second diode whose forward direction is reversed relative to that of the first diode, and means coupling the coil to the diode-resistor network so that the DC current distribution among the network elements and the coil produces an angular rotation of the coil which is a substantially linear function of the DC electric quantity.

2. A moving coil instrument provided with a linear deflection characteristic comprising, a magnet core and a yoke with an air gap to accommodate a rotatable coil, a coil rotatable about an axis and located within the yoke air gap, a non-linear relationship normally existing between the angular rotation of the coil and a direct current flowing in the coil in response to a DC electric quantity applied to the instrument, means for correcting said non-linear relationship comprising a diode-resistor network having two input terminals, means for applying the DC electric quantity to said two input terminals, said diode-resistor network comprising a first branch circuit including a first resistor connected in series with a first parallel circuit that includes a second resistor in parallel with at least one first diode connected in the forward direction relative to the DC electric quantity applied to said two input terminals, and means coupling the coil to the diode-resistor network so that the coil is connected in series with the first branch circuit and the DC current distribution among the network elements and the coil produces an angular rotation of the coil which is a substantially linear function of the DC electric quantity.

3. A moving coil instrument provided with a linear deflection characteristic comprising, a magnet core and a yoke with an air gap to accommodate a rotatable coil, a coil rotatable about an axis and located within the yoke air gap, a non-linear relationship normally existing between the angular rotation of the coil and a direct current flowing in the coil in response to a DC electric quantity applied to the instrument, means for correcting said non-linear relationship comprising a diode-resistor network having two input terminals, means for applying the DC electric quantity to said two input terminals, said diode-resistor network comprising a first branch circuit including a first resistor connected in series with a first parallel circuit that includes a second resistor in parallel with at least one first diode connected in the forward direction relative to the DC electric quantity applied to said two input terminals, and means connecting the coil in series circuit with a third resistor and the series circuit in parallel with the first branch circuit so that the DC current distribution among the network elements and the coil produces an angular rotation of the coil which is a substantially linear function of the DC electric quantity.

4. A moving coil instrument provided with a linear deflection characteristic comprising, a magnet core and a yoke with an air gap to accommodate a rotatable coil, a coil rotatable about an axis and located within the yoke air gap, a non-linear relationship normally existing between the angular rotation of the coil and a direct current flowing in the coil in response to a DC electric quantity applied to the instrument, means for correcting said non-linear relationship comprising a diode-resistor network having two input terminals, means for applying the DC electric quantity to said two input terminals, said diode-resistor network comprising a first branch circuit including a first resistor connected in series with a first parallel circuit that includes a second resistor in parallel with at least one first diode connected in the forward direction relative to the DC electric quantity applied to said two input terminals and a second diode connected in anti-parallel with the first diode, and means coupling the coil to the diode-resistor network so that the DC current distribution among the network elements and the coil produces an angular rotation of the coil which is a substantially linear function of the DC electric quantity.

5. A moving coil instrument provided with a linear deflection characteristic comprising, a magnet core and a yoke with an air gap to accommodate a rotatable coil, a coil rotatable about an axis and located within the yoke air gap, a non-linear relationship normally existing between the angular rotation of the coil and a direct current flowing in the coil in response to a DC electric quantity applied to the instrument, means for correcting said non-linear relationship comprising a diode-resistor network having two input terminals, means for applying the DC electric quantity to said two input terminals, said diode-resistor network comprising a first branch circuit including a first resistor connected in series with a first parallel circuit that includes a second resistor in parallel with at least one first diode connected in the forward direction relative to the DC electric quantity applied to said two input terminals, and means connecting the coil in series with the first branch circuit across said two input terminals so that the DC current distribution among the network elements and the coil produces an angular rotation of the coil which is a substantially linear function of the DC electric quantity.

6. A moving-coil instrument as claimed in claim 2 further comprising a third resistor connected in parallel with the coil and the first branch circuit.

7. A moving-coil instrument as claimed in claim 3 further comprising a fourth resistor connected in series with the third resistor and coil.

8. A moving-coil instrument as claimed in claim 5 further comprising a second branch circuit including a fourth resistor connected in series with a second parallel circuit that includes a fifth resistor in parallel with at least one second diode polarized in the same direction as the first diode, and means connecting the second branch circuit in parallel with the third resistor.

9. A moving-coil instrument as claimed in claim 2 further comprising a second branch circuit connected across the series connection of the coil and first branch circuit, the second branch circuit comprising a third resistor connected in series with a second parallel circuit that includes a fourth resistor in parallel with at least one second diode polarized in the same direction as the first diode, and means connecting a seventh resistor in series with the second branch circuit.

10. A moving coil instrument as claimed in claim 4 further comprising a third resistor connected in series with the coil to form a first series circuit, the first series circuit being connected in parallel with the first branch circuit across said two input terminals.

11. A moving coil instrument as claimed in claim 10 further comprising a fourth resistor connected in series with the parallel combination of the first branch circuit and the first series circuit.

12. A moving coil instrument as claimed in claim 5 further comprising a third resistor connected in parallel with the series combination of the coil and the first branch circuit.

* * * * *